(12) United States Patent
Fan

(10) Patent No.: US 7,902,663 B2
(45) Date of Patent: Mar. 8, 2011

(54) SEMICONDUCTOR PACKAGE HAVING STEPWISE DEPRESSION IN SUBSTRATE

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 267 days.

(21) Appl. No.: 12/118,052

(22) Filed: May 9, 2008

(65) Prior Publication Data

US 2009/0278256 A1 Nov. 12, 2009

(51) Int. Cl.
*H01L 23/12* (2006.01)

(52) U.S. Cl. ......... 257/711; 257/731; 257/732; 257/733; 257/738; 257/750; 257/773; 257/776; 257/784; 257/786; 257/E23.062; 257/E23.067; 257/E23.068; 257/E23.069

(58) Field of Classification Search ............... 257/738, 257/E23.062, 731, 732, 733, 711, E23.069, 257/E23.068, E23.067, 750, 773, 776, 784, 257/786

See application file for complete search history.

(56) References Cited

U.S. PATENT DOCUMENTS

| 2004/0124540 A1* | 7/2004 | Chen et al. ............ 257/777 |
| 2006/0027841 A1* | 2/2006 | Tamaki ............... 257/286 |

* cited by examiner

*Primary Examiner* — Matthew E Warren
*Assistant Examiner* — David Z Chen
(74) *Attorney, Agent, or Firm* — Muncy, Geissler, Olds & Lowe, PLLC

(57) ABSTRACT

A semiconductor package with enhanced mobility of ball terminals is revealed. A chip is attached to the substrate by a die-attaching material where the substrate has at least a stepwise depression on the covered surface to make the substrate thickness be stepwise decreased from a central line of the die-attaching area toward two opposing sides of the substrate. The die-attaching material is filled in the stepwise depression. Therefore, the thickness of the die-attaching material under cross-sectional corner(s) of the chip becomes thicker so that a row of the ball terminals away from the central line of the die-attaching area can have greater mobility without changing the appearance, dimensions, thicknesses of the semiconductor package, nor the placing plane of the ball terminals. Accordingly, the row of ball terminals located adjacent the edges or corners of the semiconductor package can withstand larger stresses without ball cracks nor ball drop. The stepwise depression can accommodate the die-attaching material to control bleeding contaminations.

11 Claims, 5 Drawing Sheets

SEMICONDUCTOR PACKAGE HAVING STEPWISE DEPRESSION IN SUBSTRATE

FIELD OF THE INVENTION

The present invention relates to a semiconductor device with semiconductor packaging technologies, especially to a semiconductor package with enhanced mobility of ball terminals.

BACKGROUND OF THE INVENTION

There are different types of semiconductor packages for different electronic products such as Ball Grid Array, BGA, having a plurality of ball terminals such as solder balls disposed at the bottoms of the semiconductor packages. Normally, the ball terminals should be formed on an exposed surface of a substrate by reflowing with sufficient numbers to be I/O connecting terminals for the semiconductor packages to electrically connect to an external printed circuit board for operations and to meet the high-density SMT requirements. During semiconductor packaging processes, substrates experience different heat treatments such as curing of die-attaching materials and encapsulant and reflowing of ball terminals. Furthermore, when a semiconductor package is under operations or under thermal cycle test, TCT, thermal stresses will generate between the semiconductor package and the external printed circuit board due to mismatch of the coefficients of thermal expansion, CTE, where the thermal stresses will exert on the ball terminals, especially on those located at the peripheries or corners of the substrate and close to the edges of IC chips causing substrate warpage and/or solder ball cracks leading to poor product reliability. Moreover, the ball terminals located at the peripheries or corners of the substrate are easily experienced the impact forces during a drop test As shown in FIG. 1, a conventional semiconductor package 100 is a window-type BGA package, primarily comprising a substrate 110, a die-attaching material 120, a chip 130, a first row of ball terminals 140, and a second row of ball terminals 150. The substrate 110 has a covered surface 111, an exposed surface 112, and a slot 115 as a wire-bonding window. The exposed surface 112 is exposed from an encapsulant 170 for SMT. A solder mask 117 is formed on the exposed surface 112 where a plurality of internal bonding fingers 116 and a plurality of external ball pads 118 are exposed from the solder mask 117 for bonding a plurality of electrical connecting components 160 and the ball terminals 140 and 150. The die-attaching material 120 is formed on the covered surface 111 of the substrate 110 to firmly attach the chip 130 onto the substrate 110. A plurality of bonding pads 132 are disposed on the active surface of the chip 130 where the electrical connecting components 160 such as bonding wires formed by wire bonding pass through the slot 115 to electrically connect the bonding pads 132 of the chip 130 to the internal bonding fingers 116 of the substrate 110. The encapsulant 170 is formed on the covered surface 111 of the substrate 110 and in the slot 115 by molding to encapsulate the chip 130 and the electrical connecting components 160.

The first row of ball terminals 140 and the second row of ball terminals 150 are disposed on the external ball pads 118 on the exposed surface 112 of the substrate 110 with the second row of ball terminals 150 relatively further away from the slot 115 than the first row of ball terminals 140. Therefore, the distance from the neutral point, DNP, to the second row of ball terminals 150 is greater than the one of the first row of ball terminals 140, i.e., the second row of ball terminals 150 are adjacent to the peripheries or corners of the substrate 110 and easily experience the concentrated stresses.

However, heat will generate during semiconductor packaging processes, such as curing of die-attaching materials 120 and the encapsulant 170, reflowing of the ball terminals 140 and 150, and the thermal cycle test, or the operation of the semiconductor packages, causing thermal stresses due to CTE mismatch of different materials exerted on the second row of ball terminals 150 leading to solder ball cracks. Moreover, the impact forces during drop tests will also exert on the second row of ball terminals 150 leading to ball drop or ball crack. The quality of electrical connections will be greatly affected by the solder ball cracks or dropped balls. Furthermore, some of the ball terminals 150 located adjacent to the corners of the chip 130 will also have solder ball cracks and ball drop issues due to substrate warpage. Moreover, the die-attaching material 120 becomes low viscosity and easily flowing during die-attaching processes with raised temperatures and exerted pressure leading to bleeding or creeping of the die-attaching material 120.

SUMMARY OF THE INVENTION

The main purpose of the present invention is to provide a semiconductor package with enhanced mobility of ball terminals by stepwise increasing the thickness of the die-attaching material toward the peripheries of the substrate to obtain greater mobility of ball terminals without affecting the appearance, dimensions, and thicknesses of a semiconductor package nor the joint plane of the ball terminals so that the ball terminals at the peripheries or at the corners of the semiconductor packages, which are far away from the central line of the chip, can withstand greater external stresses without solder ball cracks nor ball drop.

The second purpose of the present invention is to provide a semiconductor package with enhanced mobility of ball terminals by stepwise increasing the thickness of the die-attaching material at the corners of the chip to reduce the stresses exerted on the ball terminals by the corners of the chip to avoid solder ball cracks of the ball terminals.

The third purpose of the present invention is to provide a semiconductor package with enhanced mobility of ball terminals by using a stepwise depression to accommodate the die-attaching material to control bleeding.

According to the present invention, a semiconductor package with enhanced mobility of ball terminals is revealed, primarily comprising a substrate, a die-attaching material, a chip, a first row of ball terminals, and a second row of ball terminals. The substrate has a covered surface and an exposed surface where the covered surface includes a die-attaching area. The die-attaching material is formed on the covered surface of the substrate. The chip is aligned with the die-attaching area and attached to the covered surface of the substrate by the die-attaching material. The first row of ball terminals and the second row of ball terminals are disposed on the exposed surface of the substrate where the second row of ball terminals are relatively further away from a central line of the die-attaching area than the first row of ball terminals. The substrate further has at least a stepwise depression formed on the covered surface with the thickness of the substrate being stepwise decreased from the central line of the die-attaching area toward two opposing sides of the substrate. The die-attaching material is filled in the stepwise depression.

DETAIL DESCRIPTION OF THE INVENTION

Please refer to the attached drawings, the present invention will be described by means of embodiments below.

Figure 1:
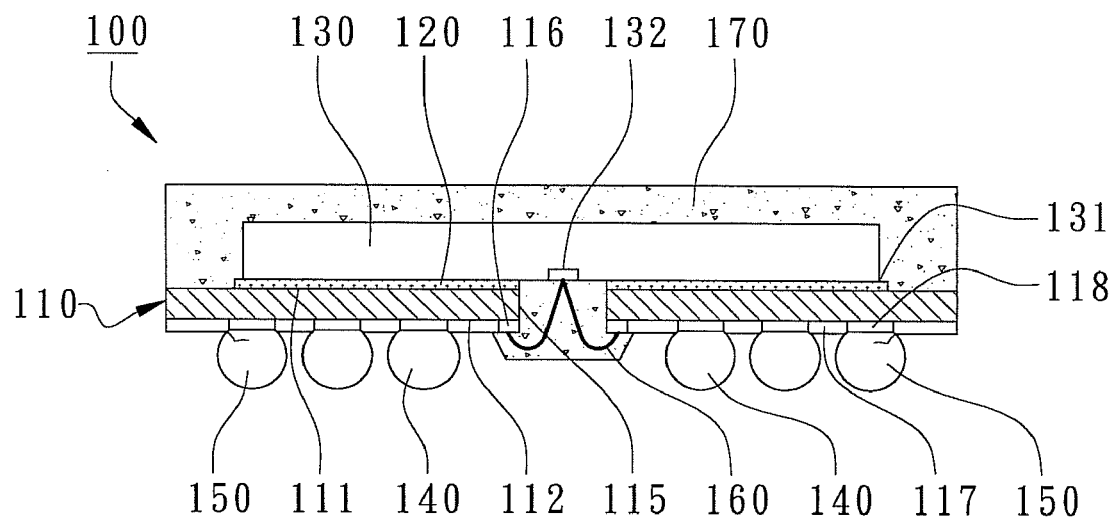
FIG. 1 shows a cross-sectional view of a conventional semiconductor package.
Figure 2:
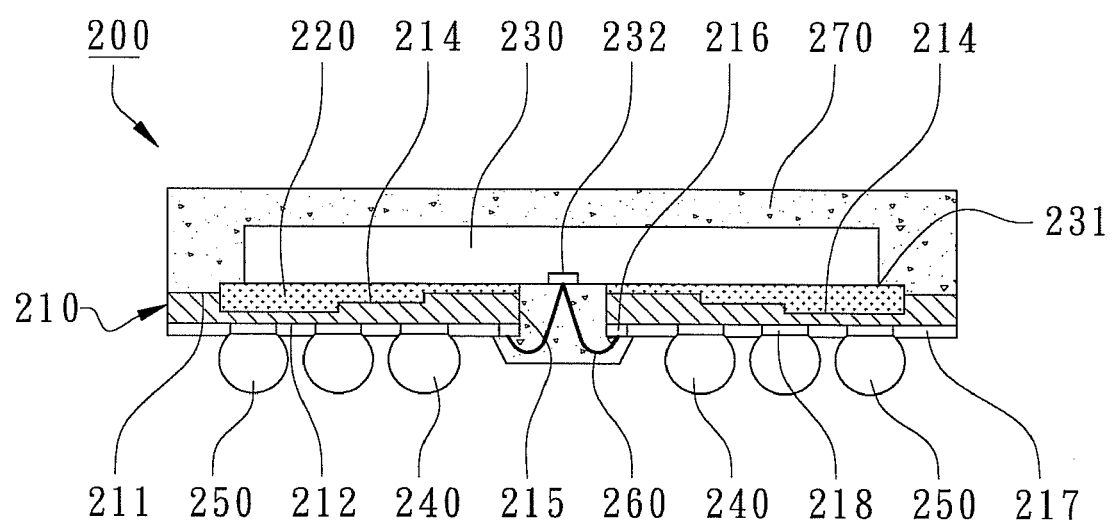
FIG. 2 shows a cross-sectional view of a semiconductor package with enhanced mobility of ball terminals according to the first embodiment of the present invention.
Figure 3:
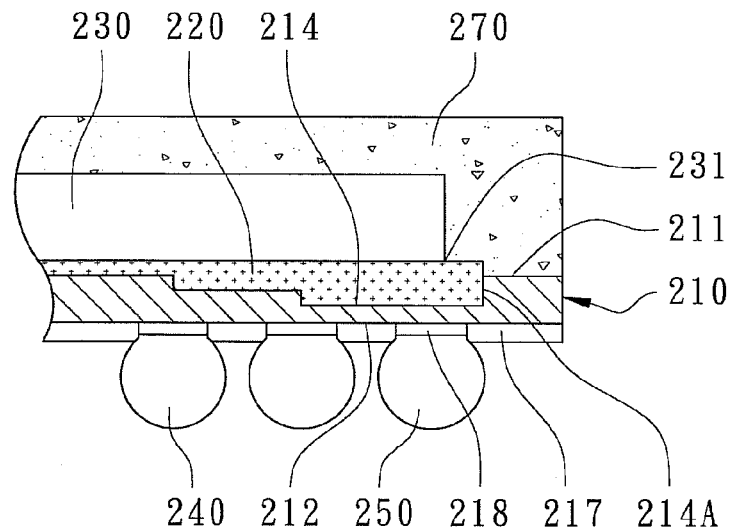
FIG. 3 shows a partially enlarged cross-sectional view of the semiconductor package according to the first embodiment of the present invention.

According to the first embodiment of the present invention, a semiconductor package with enhanced mobility of ball terminals is illustrated in the cross-sectional view of FIG. 2 and the partially enlarged cross-sectional view of FIG. 3. The semiconductor package 200 primarily comprises a substrate 210, a die-attaching material 220, a chip 230, a first row of ball terminals 240, and a second row of ball terminals 250. Therein, the substrate 210 is illustrated in the top view of FIG. 4 and the three-dimensional cross-sectional view of FIG. 5.

Figure 4:
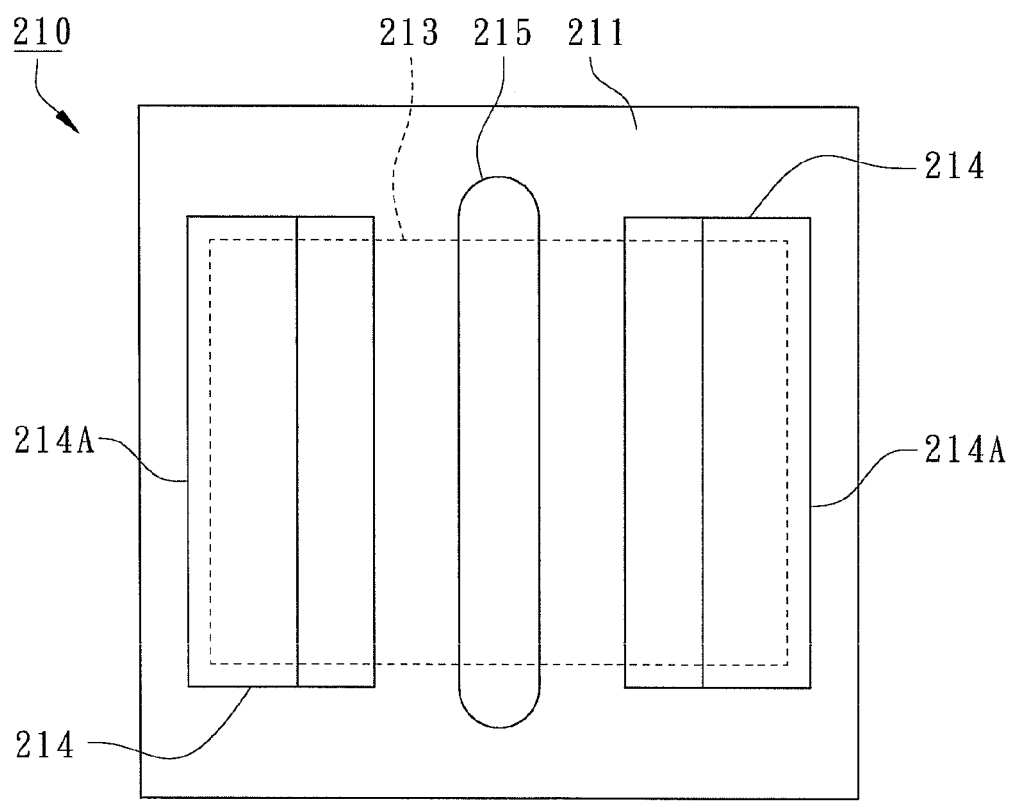
FIG. 4 shows a top view of a substrate of the semiconductor package according to the first embodiment of the present invention.

The substrate 210 has a covered surface 211, an exposed surface 212, and a slot 215 where the covered surface 211 includes a die-attaching area 213 (as shown in FIG. 4), and the dimension of the die-attaching area 213 is approximately equal to the one of the chip 230. The second ball terminals 250 are linearly disposed in parallel to a central line of the die-attaching area 213 and are relatively further away from the central line of the die-attaching area 213 than the first row of ball terminals 240. In the present embodiment, the central line of the die-attaching area 213 is located at the slot 215 aligned with the arranging direction of the bonding pads 232 of the chip 230. The slot 215 penetrates from the covered surface 211 to the exposed surface 212 of the substrate 210 to be the wire-bonding window of a window-type BGA package. The substrate 210 further has a plurality of external ball pads 218 and a plurality of internal bonding fingers 216 on the exposed surface 212 where the external ball pads 218 are disposed in multiple rows or in an array. Furthermore, a solder mask 217 is formed on the exposed surface 212 of the substrate 210 to protect the traces with the internal bonding fingers 216 and the external ball pads 218 exposed for bonding electrical connecting components 260 such as bonding wires and ball terminals 240, 250 such as solder balls. Preferably, the substrate 210 is a single-layer printed circuit board to reduce the cost of the substrate 210.

Figure 5:
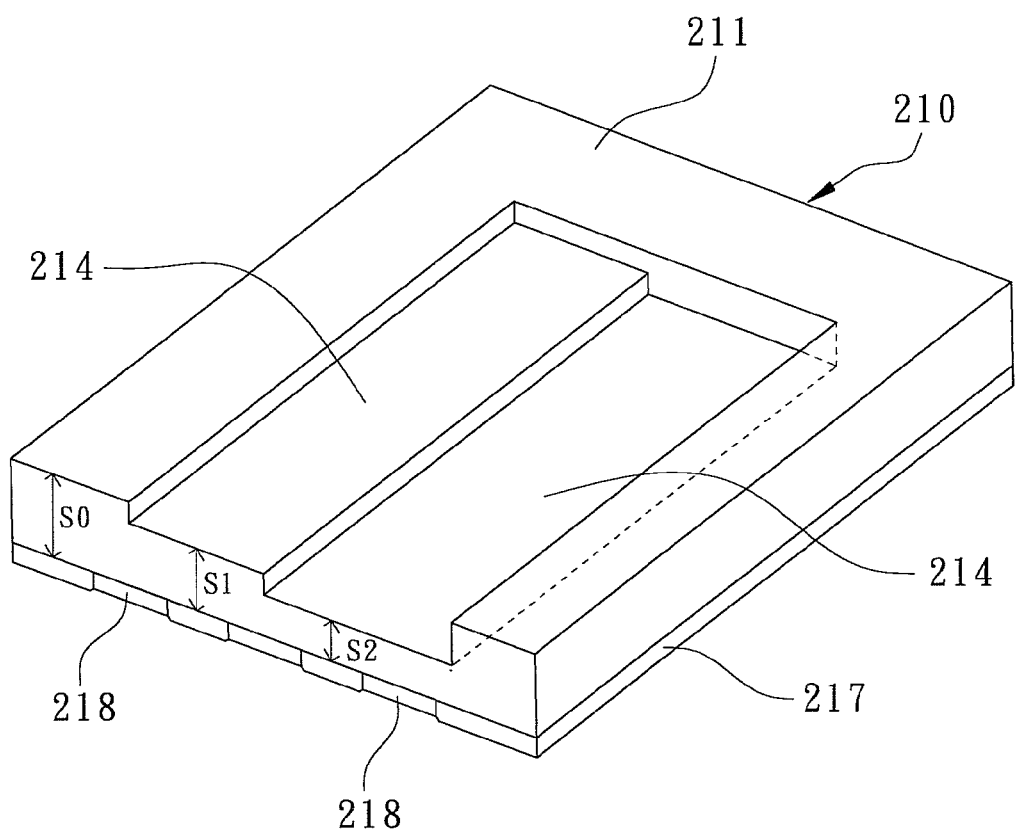
FIG. 5 shows a three-dimensional cross-sectional view of the substrate of the semiconductor package according to the first embodiment of the present invention.

Furthermore, as shown in FIG. 2 and FIG. 5, the substrate 210 further has a stepwise depression 214 formed on the covered surface 211 to make the substrate thickness stepwise decrease from the central line of the die-attaching area 213. The stepwise depression 214 is formed by lamination of different daughter substrates with different dimensions of openings. Moreover, the step(s) in the stepwise depressions 214 in the present invention is not limited. In the present embodiment, two stepwise depressions 214 are disposed at two sides of the slot 215 (the central line of the die-attaching area 213). Preferably, the slot 215 is not connected with the stepwise depression 214 to avoid bleeding of the die-attaching material 220 in the slot 215.

The die-attaching material 220 is formed on the covered surface 211 of the substrate 210. Preferably, the die-attaching material 220 can be chosen from liquid epoxy, B-stage paste, or other die-attaching material with multiple curing steps. Moreover, the die-attaching material 220 can be pre-formed on the substrate 210 before semiconductor packaging processes by dispensing or by printing. The die-attaching material 220 is filled in the stepwise depression 214 for adhering the chip 230.

As shown in FIG. 2 and FIG. 3, the chip 230 is aligned with the die-attaching area 213 (as shown in FIG. 4) and attached to the covered surface 211 of the substrate 210 by the die-attaching material 220. In the present embodiment, the chip 230 has a plurality of bonding pads 232 disposed at the center of the active surface with a single row or with double rows. The die-attaching material 220 adheres the active surface of the chip 230 with the bonding pads 232 aligned within the slot 215. Furthermore, as shown in FIG. 3 again, the chip 230 has a cross-sectional corner 231 in contact with the die-attaching material 220 approximately parallel to the disposing direction of the second row of ball terminals 250. As shown in FIG. 3 and FIG. 4, the stepwise depression 214 has an edge 214A located outside the die-attaching area 213 and adjacent to the cross-sectional corner 231 to increase the thickness of the die-attaching material 220 measured between the cross-sectional corner 231 and the second row of ball terminals 250 (as shown in FIG. 3) to reduce the stresses exerted by the cross-sectional corner 231 of the chip 230 to the second row of ball terminals 250.

The ball terminals can be divided into a first row of ball terminals 240 and a second row of ball terminals 250. This depends on the distance from the row of ball terminals to the central line of the substrate 210 or the distance from neutral point, DNP, where the second row of ball terminals 250 are further away from the DNP of the substrate 210. As shown in FIG. 2 and FIG. 3, the first row of ball terminals 240 and the second row of ball terminals 250 are disposed on the external ball pads 218 on the exposed surface 212 of the substrate 210 with the second row of ball terminals 250 relatively further away from the central line of the die-attaching area 213 (as shown in FIG. 4) than the first row of ball terminals 240. To be more specific, the first row of ball terminals 240 and the second row of ball terminals 250 include metal balls, solder paste, contact pads, or contact pins so that the semiconductor package 200 can electrically connect to an external printed circuit board (not shown in the figure) by the first row of ball terminals 240 and the second row of ball terminals 250. One or more rows of ball terminals can be disposed between the first row of ball terminals 240 and the second row of ball terminals 250.

By means of the stepwise depression 214, the thickness of the substrate 210 is stepwise decreased from the central line of the die-attaching area 213 toward two opposing sides of the substrate 210 (as shown in FIG. 4). To be more specific, as shown in FIG. 5, the substrate 210 has a substrate thickness S0 measured from the exposed surface 212 to the covered surface. Through the stepwise depression 214, the substrate 214 has a first decreased thickness S1 measured from the first row of ball terminals 240 to a first step of the stepwise depression 214 and a second decreased thickness S2 measured from the second row of ball terminals 250 to a second step of the stepwise depression 214 where the first decreased thickness S1 is smaller than the substrate thickness S0 and the second decreased thickness S2 is smaller than the first decreased thickness S1. Furthermore, the first decreased thickness S1 and the second decreased thickness S2 can be appropriately adjusted by the CTE of the solder mask 217, the die-attaching material 220, and the encapsulant 270 to avoid substrate warpage during temperature variations. For example, as shown in FIG. 3 and FIG. 5, the thickness of the die-attaching material 220 between the cross-sectional corner 231 and the second row of ball terminals 250 is greater than the second decreased thickness S2 to allow the second row of ball terminals 250 become more movable to absorb stresses. To be more specific, the second row of ball terminals 250 are aligned within an area of the exposed surface 212 corresponding to the stepwise depression 214 to increase the thickness of the substrate 210 measured between the second row of ball terminals 250 and the chip 230. Preferably, the second row of ball terminals 250 are adjacent to the two symmetrical parallel edges 214A of the stepwise depression 214 parallel to the opposing sides of the substrate 210 (as shown in FIGS. 3 and 4) to ensure that the die-attaching material 220 has an economical covering area limited by the stepwise depression 214 and a short distance to the second row of ball terminals 250. Regarding to the vertical distance from the chip 230 to the second row of ball terminals 250, the die-attaching material 220 occupies a larger proportion, even more than the one of the substrate 210. Accordingly, the second row of ball terminals 250 have an enhanced stress buffering capability with respect to the first row of ball terminals 240. The second row of ball terminals 250 under stresses can withstand larger displacement without solder ball cracks nor ball drop.

As shown in FIG. 3 and FIG. 4, during die-attaching processes, the die-attaching material 220 is first printed on the covered surface 211 of the substrate 210 in liquid form to firmly attach the chip 230. Since the stepwise depression 214 covers most of the die-attaching area 213, more die-attaching material 220 can be accommodated effectively. The bleeding of the die-attaching material 220 is avoided. Therefore, the stepwise depression 214 can limit and control the flowing of the die-attaching material 220 without bleeding. As shown in FIG. 3, the die-attaching material 220 will not bleed to the peripheries of the substrate 210 nor the slot 215 so that the encapsulant 270 can fully encapsulate the die-attaching material 220 to ensure the quality of the semiconductor package 200.

To be more specific, as shown in FIG. 3, since the die-attaching material 220 is filled in the stepwise depression 214, the thickness of the die-attaching material 220 measured between the cross-sectional corner 231 and the second row of ball terminals 250 is greater than the thickness of the substrate 210 measured between the cross-sectional corner 231 and the second row of ball terminals 250. Therefore, the thickness of the die-attaching material 220 is stepwise increased until to the cross-sectional corner 231 of the chip 230 so that the second row of ball terminals 250, which is further away from the center of the die-attaching area 213, can have greater mobility without changing the appearance, dimensions, thicknesses of the semiconductor package 200, nor the joint plane of the ball terminals 240 and 250. Therefore, the second row of ball terminals 250 having a larger DNP of the semiconductor package 200 can withstand larger stresses without solder ball cracks nor ball drop.

In the present embodiment, as shown in FIG. 2 again, the internal bonding fingers 216 are formed on the exposed surface 211 of the substrate 210 adjacent to the slot 215. The semiconductor package 200 further comprises a plurality of electrical connecting components 260 electrically connecting the bonding pads 232 of the chip 230 to the internal bonding fingers 216 of the substrate 210 through the slot 215. The electrical connecting components 260 can be bonding wires formed by wire-bonding technology.

The semiconductor package 200 further comprises an encapsulant 270 formed on the covered surface 211 of the substrate 210 and in the slot 215 to encapsulate the chip 230 and the electrical connecting components 260 and to protect the chip 230 and the electrical connecting components 260 from the contaminations of the environments. In the present embodiment, the encapsulant 270 is formed by transfer molding to completely encapsulate the chip 230 and the die-attaching material 220. Alternatively, in different embodiment, the encapsulant 270 may only encapsulates the sidewalls of the chip 230 with the back surface of the chip 230 exposed to become bare-die semiconductor packages.

Figure 6:
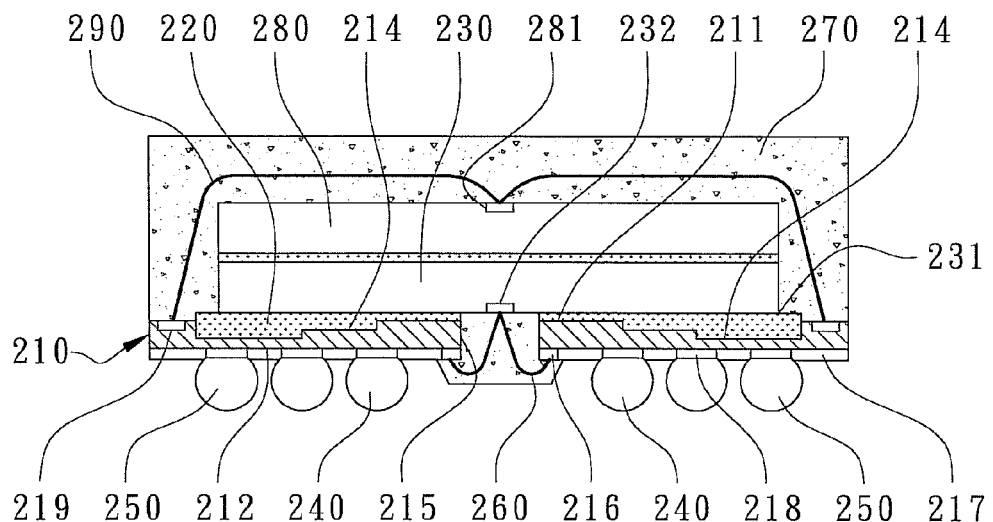
FIG. 6 shows a cross-sectional view of a semiconductor package with enhanced mobility of ball terminals according to the second embodiment of the present invention.

In the second embodiment of the present invention, another semiconductor package with enhanced mobility of ball terminals is revealed and implemented in back-to-back DDP wBGA packaging configuration. The semiconductor package is illustrated in cross-sectional view of FIG. 6, where the major components are almost the same as the first embodiment with the same figure numbers such as a substrate 210, a die-attaching material 220, a chip 230, a first row of ball terminals 240, and a second row of ball terminals 250. The substrate 210 further has a plurality of second bonding fingers 219 formed on the covered surface 211 and outside the stepwise depression 214. The semiconductor package further comprises a second chip 280 where the second chip 280 is back-to-back stacked on the back surface of the chip 230. But without any limitations, more chips can be stacked such as three chips, four chips, or more to form a multi-chip semiconductor package to increase functionality. To be more specific, a plurality of second bonding pads 281 are disposed on the active surface of the second chip 280 where the bonding pads 281 of the second chip 280 are electrically connected to the second bonding fingers 219 by a plurality of second electrical connecting components 290 such as bonding wires. The thicknesses and numbers of the stepwise depressions 214 can be appropriately adjusted by the CTE of the solder mask 217, the die-attaching material 220, and the encapsulant 270 and by the total package thickness to avoid substrate warpage during temperature variations. The second row of ball terminals 250 are aligned within an area of the exposed surface 212 corresponding to the stepwise depression 214 to achieve better stress buffering capability so that the second row of ball terminals 250 will not easily break or drop during thermal cycle tests or actual operations to ensure good electrical connection quality and reliability.

Figure 7:
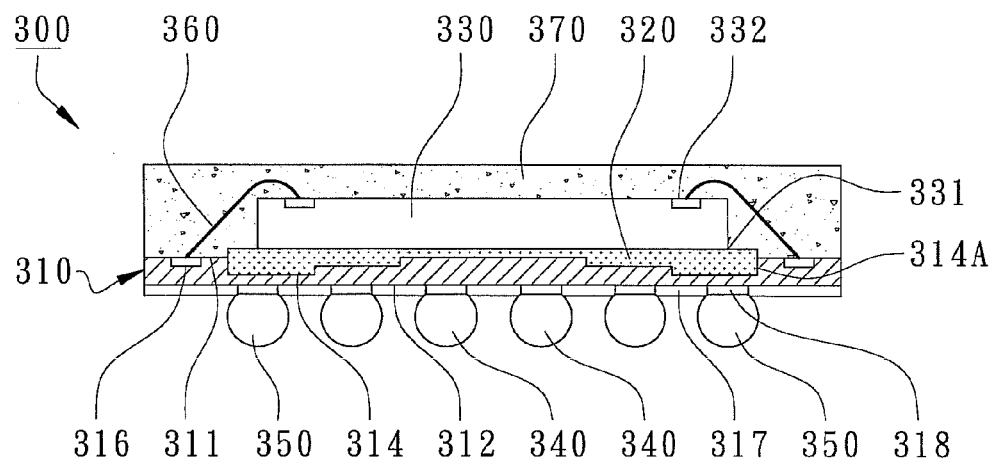
FIG. 7 shows a cross-sectional view of a semiconductor package with enhanced mobility of ball terminals according to the third embodiment of the present invention.

According to the third embodiment of the present invention, another semiconductor package with enhanced mobility of ball terminals is revealed as shown in FIG. 7. The semiconductor package 300 primarily comprises a substrate 310, a die-attaching material 320, a chip 330, a first row of ball terminals 340, and a second row of ball terminals 350. The substrate 310 is illustrated in the three-dimensional view of FIG. 8. The substrate 310 has a covered surface 311 and an exposed surface 312 where the covered surface 311 includes a die-attaching area 313, and the dimension of the die-attaching area 313 is approximately equal to the one of the chip 330. A solder mask 317 is formed on the exposed surface 312 of the substrate 310 where the solder mask 317 is an electrically isolated material to protect the traces with the external ball pads 318 exposed for bonding the first row of ball terminals 340 and the second row of ball terminals 350. Furthermore, as shown in FIG. 7 and FIG. 8 again, the substrate 310 further has at least a stepwise depression 314 formed on the covered surface 311 to make the substrate thickness be stepwise decreased from a central stage of the die-attaching area 313 toward four sides of the substrate 310. The peripheries of the stepwise depression 314 are slightly greater than the ones of the die-attaching area 313. In the present embodiment, the substrate 310 further has a plurality of internal bonding fingers 316 formed on the covered surface 311 located outside the stepwise depression 314.

As shown in FIG. 7, the die-attaching material 320 is formed on the covered surface 311 of the substrate 310. Preferably, the die-attaching material 320 can be chosen from liquid epoxy, B-stage paste, or other die-attaching material where the liquid or paste states can be controlled by the temperatures. Preferably, the die-attaching material 320 is a B-stage paste pre-formed on the substrate 310 before semiconductor packaging processes by dispensing or by printing.

The chip 330 is aligned with the die-attaching area 313 and attached to the covered surface 311 of the substrate 310 by the die-attaching material 320. In the present embodiment, the die-attaching material 320 adheres the back surface of the chip 330. The chip 330 has a plurality of bonding pads 332 disposed at the peripheries of the active surface with a single row or multiple rows. The bonding pads 332 of the chip 330 are electrically connected to the internal bonding fingers 316 of the substrate 310 by a plurality of electrical connecting components 360 such as bonding wires. The chip 330 and the electrical connecting components 360 are encapsulated by an encapsulant 370 formed on the covered surface 311 to provide proper protection. Furthermore, the die-attaching material 320 is filled in the stepwise depression 314. The stepwise depression 314 can control the bleeding of the die-attaching material 320 to avoid the internal bonding fingers 316 from contaminations and to ensure completely encapsulation of the die-attaching material 320 by the encapsulant 370.

As shown in FIG. 7, the first row of ball terminals 340 are disposed on the external ball pads 318 adjacent to the center of the exposed surface 312 of the substrate 310 and the second row of ball terminals 350 are disposed on the external ball pads 318 far away from the center of the exposed surface 312 of the substrate 310. Therefore, the second row of ball terminals 350 are relatively further away from a central line of the die-attaching area 313 than the first row of ball terminals 340, i.e., the second row of ball terminals 350 are relatively further away from the central line of the substrate 310 than the first row of ball terminals 340. The depths and the numbers of the stepwise depression 314 are appropriately adjusted by the CTE of the solder mask 317, the die-attaching material 320, and the encapsulant 370 to avoid substrate warpage leading to solder ball cracks nor ball drop of the second row of ball terminals 350.

Figure 8:
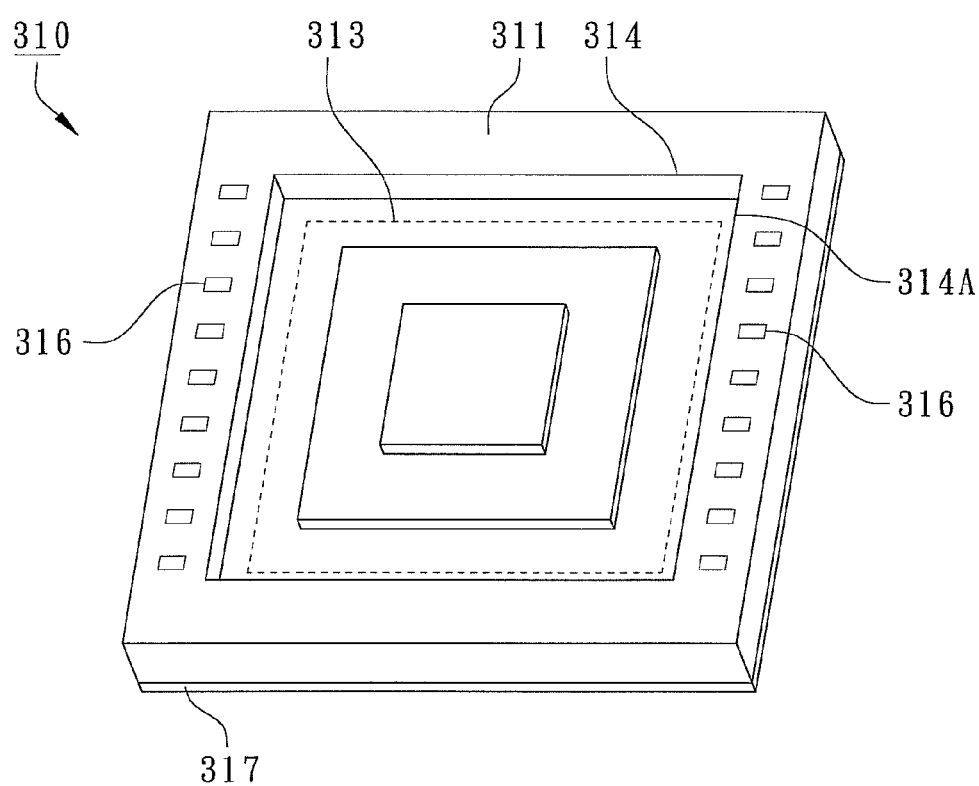
FIG. 8 shows a three-dimensional view of a substrate of the semiconductor package according to the third embodiment of the present invention.

Preferably, as shown in FIG. 7, the chip 330 has a cross-sectional corner 331 in contact with the die-attaching material 320 where the cross-sectional corner 331 is approximately parallel to the second row of ball terminals 350. Furthermore, as shown in FIG. 7 and FIG. 8, the stepwise depression 314 has an edge 314A located outside the die-attaching area 313 adjacent to the cross-sectional corner 331 in parallel to increase the thickness of the die-attaching material 320 measured between the cross-sectional corner 331 and the second row of ball terminals 350 to reduce the stresses exerted by the cross-sectional corner 331 of the chip 230 to the second ball terminals 350.

Moreover, the stepwise depression 314 can limit and control the flowing of the die-attaching material 320 without bleeding. As shown in FIG. 7, the die-attaching material 320 will not bleed to the sidewalls of the substrate 310 to ensure that the die-attaching material 320 is completely encapsulated by the encapsulant 370. The quality of the semiconductor package 300 is improved.

The above description of embodiments of this invention is intended to be illustrative and not limiting. Other embodiments of this invention will be obvious to those skilled in the art in view of the above disclosure.

What is claimed is:

1. A semiconductor package primarily comprising:
   a substrate having a covered surface and an exposed surface, wherein the covered surface includes a die-attaching area, the substrate being a printed circuit board;
   a die-attaching material formed on the covered surface of the substrate;
   a chip aligned with the die-attaching area and attached to the covered surface of the substrate by the die-attaching material;
   a first row of ball terminals disposed on the exposed surface of the substrate; and
   a second row of ball terminals disposed on the exposed surface of the substrate, wherein the second row of ball terminals are relatively away from a central line of the die-attaching area than the first row of ball terminals;
   wherein the substrate further has at least a stepwise depression formed on the covered surface to make a thickness of the substrate from the covered surface to the exposed surface be stepwise decreased from the central line of the die-attaching area toward two opposing sides of the substrate;
   wherein the stepwise depression is a groove for accommodating the die-attaching material;
   wherein the die-attaching material is filled in the stepwise depression;
   wherein the substrate has a first decreased thickness measured from the first row of ball terminals to a first step of the stepwise depression and a second decreased thickness measured from the second row of ball terminals to a second step of the stepwise depression, wherein the second decreased thickness is smaller than the first decreased thickness;
   wherein the chip has a cross-sectional corner in contact with the die-attaching material approximately parallel to a disposing direction of the second row of ball terminals, wherein the stepwise depression has a groove edge located outside the die-attaching area and adjacent to the cross-sectional corner.

2. The semiconductor package as claimed in claim 1, wherein the second row of ball terminals are aligned within an area of the exposed surface corresponding to the stepwise depression.

3. The semiconductor package as claimed in claim 2, wherein the second row of ball terminals are adjacent to two symmetrical edges of the stepwise depression parallel to two opposing sides of the substrate.

4. The semiconductor package as claimed in claim 1, wherein a thickness of the die-attaching material between the cross-sectional corner and the second row of ball terminals is greater than the second decreased thickness.

5. A semiconductor package primarily comprising:
   a substrate having a covered surface and an exposed surface, wherein the covered surface includes a die-attaching area, the substrate being a printed circuit board;
   a die-attaching material formed on the covered surface of the substrate;
   a chip aligned with the die-attaching area and attached to the covered surface of the substrate by the die-attaching material;

a first row of ball terminals disposed on the exposed surface of the substrate; and a second row of ball terminals disposed on the exposed surface of the substrate, wherein the second row of ball terminals are relatively away from a central line of the die-attaching area than the first row of ball terminals;

a plurality of electrical connecting components electrically connecting the chip to the substrate and an encapsulant formed on the covered surface and encapsulating the electrical connecting components and the die-attaching material;

wherein the substrate further has at least a stepwise depression formed on the covered surface to make a thickness of the substrate from the covered surface to the exposed surface be stepwise decreased from the central line of the die-attaching area toward two opposing sides of the substrate;

wherein the stepwise depression is a groove for accommodating the die-attaching material;

wherein the die-attaching material is filled in the stepwise depression;

wherein the chip has an active surface adhered by the die-attaching material, wherein the substrate has a slot penetrating through the covered surface and the exposed surface, wherein the electrical connecting components pass through the slot.

6. The semiconductor package as claimed in claim 5, wherein the encapsulant is further formed in the slot.

7. A semiconductor package primarily comprising:

a substrate having a covered surface and an exposed surface, wherein the covered surface includes a die-attaching area, the substrate being a printed circuit board;

a die-attaching material formed on the covered surface of the substrate;

a chip aligned with the die-attaching area and attached to the covered surface of the substrate by the die-attaching material; and a plurality of ball terminals disposed on the exposed surface of the substrate;

wherein the substrate further has at least a stepwise depression formed on the covered surface to make a thickness of the substrate from the covered surface to the exposed surface be stepwise decreased from a central line of the die-attaching area toward two opposing sides of the substrate;

wherein the stepwise depression is a groove for accommodating the die-attaching material;

wherein the die-attaching material is filled in the stepwise depression;

wherein the chip has a cross-sectional corner in contact with the die-attaching material;

wherein the stepwise depression has a groove edge located outside the die-attaching area and adjacent to the cross-sectional corner;

wherein some of the ball terminals aligned within an area of the exposed surface corresponding to the stepwise depression are arranged in a row approximately parallel to the cross-sectional corner.

8. The semiconductor package as claimed in claim 7, wherein the substrate has a decreased thickness measured between a row of ball terminals and the cross-sectional corner, wherein a thickness of the die-attaching material measured between the row of ball terminals and the cross-sectional corner is greater than the decreased thickness.

9. The semiconductor package as claimed in claim 7, further comprising a plurality of electrical connecting components electrically connecting the chip to the substrate and an encapsulant formed on the covered surface and encapsulating the electrical connecting components and the die-attaching material.

10. The semiconductor package as claimed in claim 9, wherein the chip has an active surface adhered by the die-attaching material, wherein the substrate has a slot penetrating through the covered surface and the exposed surface, wherein the electrical connecting components pass through the slot.

11. The semiconductor package as claimed in claim 10, wherein the encapsulant is further formed in the slot.

* * * * *